US012236904B2

United States Patent
Yang et al.

(10) Patent No.: US 12,236,904 B2
(45) Date of Patent: Feb. 25, 2025

(54) LED BACKLIGHT MATRIX DRIVING CIRCUIT AND DRIVING VOLTAGE DETECTION AND REGULATION METHOD THEREFOR

(71) Applicant: X-SIGNAL INTEGRATED CO., LTD., Beijing (CN)

(72) Inventors: Guanou Yang, Beijing (CN); Huijiao Jin, Beijing (CN)

(73) Assignee: X-SIGNAL INTEGRATED CO., LTD., Beijing (CN)

( * ) Notice: Subject to any disclaimer, the term of this patent is extended or adjusted under 35 U.S.C. 154(b) by 0 days.

(21) Appl. No.: 18/743,176

(22) Filed: Jun. 14, 2024

(65) Prior Publication Data

US 2024/0331646 A1   Oct. 3, 2024

Related U.S. Application Data

(63) Continuation of application No. PCT/CN2022/135201, filed on Nov. 30, 2022.

(30) Foreign Application Priority Data

Dec. 15, 2021 (CN) .......................... 202111540104.8

(51) Int. Cl.
  *G09G 3/34* (2006.01)
  *G01R 19/25* (2006.01)
(52) U.S. Cl.
  CPC .......... *G09G 3/3406* (2013.01); *G01R 19/25* (2013.01)
(58) Field of Classification Search
  CPC ......... G09G 2310/08; G09G 2320/064; G09G 2330/025; G09G 2330/045
  See application file for complete search history.

(56) References Cited

U.S. PATENT DOCUMENTS

2008/0136771 A1   6/2008   Chen et al.
2011/0102451 A1*  5/2011   Broga ................... G09G 3/3406
                                                  345/589

(Continued)

FOREIGN PATENT DOCUMENTS

CN    103177698 A    6/2013
CN    103606354 A    2/2014

(Continued)

OTHER PUBLICATIONS

CN211348585U UV-LED lamp source control circuit with short circuit and open circuit detection Wu Wenjuan Aug. 25, 2020 (Year: 2020).*

(Continued)

*Primary Examiner* — Van N Chow
(74) *Attorney, Agent, or Firm* — Bayramoglu Law Offices LLC (57) ABSTRACT

An LED backlight driving circuit with a voltage regulating unit is provided. The LED backlight driving circuit includes a power supply unit, an LED string, an ADC voltage detection circuit, and a driving controller; the ADC voltage detection circuit is used to detect a voltage value $V_{led}$ of a negative terminal of a LED string, and the ADC voltage detection circuit includes an ADC sampling module that converts the measured voltage value $V_{led}$ at the negative terminal of the LED string into a voltage numerical code; for the numerical code of the negative terminal voltage value $V_{led}$ measured by the ADC sampling module, a first threshold $V_1$ and a second threshold $V_2$ are set.

5 Claims, 5 Drawing Sheets

(56) References Cited

U.S. PATENT DOCUMENTS

2012/0207205 A1* 8/2012 Zhao .................... G09G 3/3406
                                                        375/238
2013/0134889 A1   5/2013 Chen et al.
2021/0043821 A1* 2/2021 Hussell ................ H01L 25/167

FOREIGN PATENT DOCUMENTS

| CN | 109922557 A | 6/2019 |
| CN | 211348585 U | 8/2020 |
| CN | 113589128 A | 11/2021 |
| CN | 114170977 A | 3/2022 |

OTHER PUBLICATIONS

CN109922557A Multi-channel LED constant-current driving circuit, multi-channel LED constant-current driving device Jun. 21, 2019 Liu Xianghua (Year: 2019).*

* cited by examiner

LED BACKLIGHT MATRIX DRIVING CIRCUIT AND DRIVING VOLTAGE DETECTION AND REGULATION METHOD THEREFOR

CROSS-REFERENCE TO THE RELATED APPLICATIONS

This application is a continuation application of International Application No. PCT/CN2022/135201, filed on Nov. 30, 2022, which is based upon and claims priority to Chinese Patent Application No. 202111540104.8, filed on Dec. 15, 2021, the entire contents of which are incorporated herein by reference.

TECHNICAL FIELD

The present invention relates to the field of communication technology, and in particular to an LED backlight driving circuit and a driving voltage detection and regulation method therefor.

BACKGROUND

Liquid crystal display (LCD) is a kind of screen display application that accounts for the largest proportion of modern display panels. Liquid crystal materials used in LCD panels cannot emit light by itself, and thus LCD panels require a backlight source to provide display light. LED backlight sources have the advantages of energy saving, environmental protection, and high performance, and are widely used in LCD display panels. The performance of LED backlight source driving circuits is crucial to LCD display panels. An existing LED backlight driving circuit detects the voltage value $V_{led}$ at the negative terminal of a LED string using a comparator circuit in a detection unit, and then determines, by a driving chip, the state of the LED string, including the three states of short circuit, open circuit, and voltage deviation of the string. Since the comparator cannot directly output the accurate value of the voltage value $V_{led}$ at the negative terminal of the LED string and can output high-low signals only, when the voltage regulation is required, feedback regulation of the driving voltage $V_{boost}$ is performed by the driving chip to increase or decrease the voltage. Such regulation is repeatedly carried out many times until the negative terminal voltage values $V_{led}$ of all LED string channels meet the set value. Such a regulation method has poor flexibility and a long regulation time. In addition, the circuit design in which the detection unit in the driving chip employs a comparator requires each of the LED string channels to be connected with three comparators. Such a circuit structure increases the wiring area and cost of the chip.

Accordingly, there is a demand in the prior art for a LED backlight driving circuit that allows simplification of the circuit, accurate detection of the voltage value $V_{led}$ at the negative terminal of the LED string, and simplification of the regulation process of the driving voltage $V_{boost}$.

SUMMARY

One of the technical problems to be solved by the present invention is to provide an LED backlight driving circuit with a voltage regulating unit. The LED backlight driving circuit with a voltage regulating unit can accurately detect the voltage value $V_{led}$ at the negative terminal of a LED string and simplify the regulation process of the driving voltage $V_{boost}$. Additionally, the driving circuit can simplify the circuit structure and reduce the wiring area of a driving chip.

In order to solve the above technical problems, the present invention provides an LED backlight driving circuit with a voltage regulating unit, in which the LED backlight driving circuit includes a power supply unit, an LED string, an analog to digital converter (ADC) voltage detection circuit, and a driving controller; the ADC voltage detection circuit is used to detect a voltage value $V_{led}$ of a negative terminal of a LED string, to obtain an accurate measurement value of the negative terminal voltage value $V_{led}$; and the ADC voltage detection circuit includes an ADC sampling module that converts the measured voltage value $V_{led}$ at the negative terminal of the LED string into a voltage numerical code, which is to be output to the driving controller.

For the numerical code of the negative terminal voltage value $V_{led}$ measured by the ADC sampling module, a first threshold $V_1$ and a second threshold $V_2$ are set, which satisfy a relationship of the first threshold $V_1$>the second threshold $V_2$.

When the numerical code of the negative terminal voltage value $V_{led}$ measured by the ADC sampling module is greater than or equal to the first threshold value $V_1$, the driving controller determines that a short circuit failure occurs in the LED string in the driving circuit.

When the numerical code of the negative terminal voltage value $V_{led}$ measured by the ADC sampling module is less than or equal to the second threshold value $V_2$, the driving controller determines that an open circuit failure occurs in the LED string in the driving circuit.

In one embodiment, for the numerical code of the negative terminal voltage value $V_{led}$ measured by the ADC sampling module, a third threshold $V_3$ and a fourth threshold $V_4$ are further provided, which satisfy a relationship of the first threshold $V_1$>the third threshold $V_3$>the fourth threshold $V_4$>the second threshold $V_2$.

When the numerical code of the negative terminal voltage value $V_{led}$ measured by the ADC sampling module is less than or equal to the third threshold value $V_3$ and greater than or equal to the fourth threshold value $V_4$, the driving controller controls the power supply unit to keep a driving voltage $V_{boost}$ unchanged.

When the numerical code of the negative terminal voltage value $V_{led}$ measured by the ADC sampling module is less than the first threshold value $V_1$ and greater than the third threshold value $V_3$, the driving controller controls the power supply unit to lower the driving voltage $V_{boost}$, and the numerical code value of the regulation amount of voltage is the difference between the numerical code of the measured negative terminal voltage value $V_{led}$ and the third threshold value $V_3$.

When the numerical code of the negative terminal voltage value $V_{led}$ measured by the ADC sampling module is greater than the second threshold value $V_2$ and less than the fourth threshold value $V_4$, the driving controller controls the power supply unit to increase the driving voltage $V_{boost}$, and the numerical code of the regulation amount of voltage is the difference between the numerical code of the measured negative terminal voltage value $V_{led}$ and the fourth threshold value $V_4$.

In one embodiment, the ADC voltage detection circuit includes a first control metal oxide semiconductor (MOS) tube 1, the ADC sampling module 2, a first resistor 3, a second resistor 4, and a third resistor 5; the first resistor 3 is connected at one end thereof to the negative terminal of the LED string and at the other end to the drain of the first control MOS tube 1, the source of the first control MOS tube 1 is connected to one end of the second resistor 4, the other end of the second resistor 4 is connected to one end of the third resistor 5, and the other end of the third resistor 5 is grounded; and the gate of the first control MOS tube 1 is connected to a PWM control signal, and the ADC sampling module 2 samples a potential between the second resistor 4 and the third resistor 5.

In comparison with the prior art, one or more embodiments of the present invention may have the following advantages:
1. In the present invention, the ADC voltage detection module is used to accurately measure the voltage value at the negative terminal of the LED string, so that the driving circuit of the present invention can accurately detect the working state of the LED string, thereby allowing more accurate condition control for the shutdown of the LED string caused by a short circuit according to actual conditions.
2. In the present invention, the ADC voltage detection module is used to accurately measure the voltage value at the negative terminal of the LED string, so that the driving voltage of the LED string can be regulated more rapidly and accurately, whereby the driving voltage can be directly regulated to a preset voltage range.

Other features and advantages of the present invention will be described in the following description, and partly become apparent from the description, or are appreciated by implementation of the present invention. The objects and other advantages of the present invention can be realized and obtained by the structures particularly indicated in the description, claims, and drawings.

BRIEF DESCRIPTION OF THE DRAWINGS

Accompanying drawings are used to provide further understanding of the present invention and constitute a part of the specification. Along with the embodiments of the present invention, the drawings are used to illustrate the present invention, and is not a limitation of the present invention. In the drawings.

DETAILED DESCRIPTION OF THE EMBODIMENTS

Figure 4:
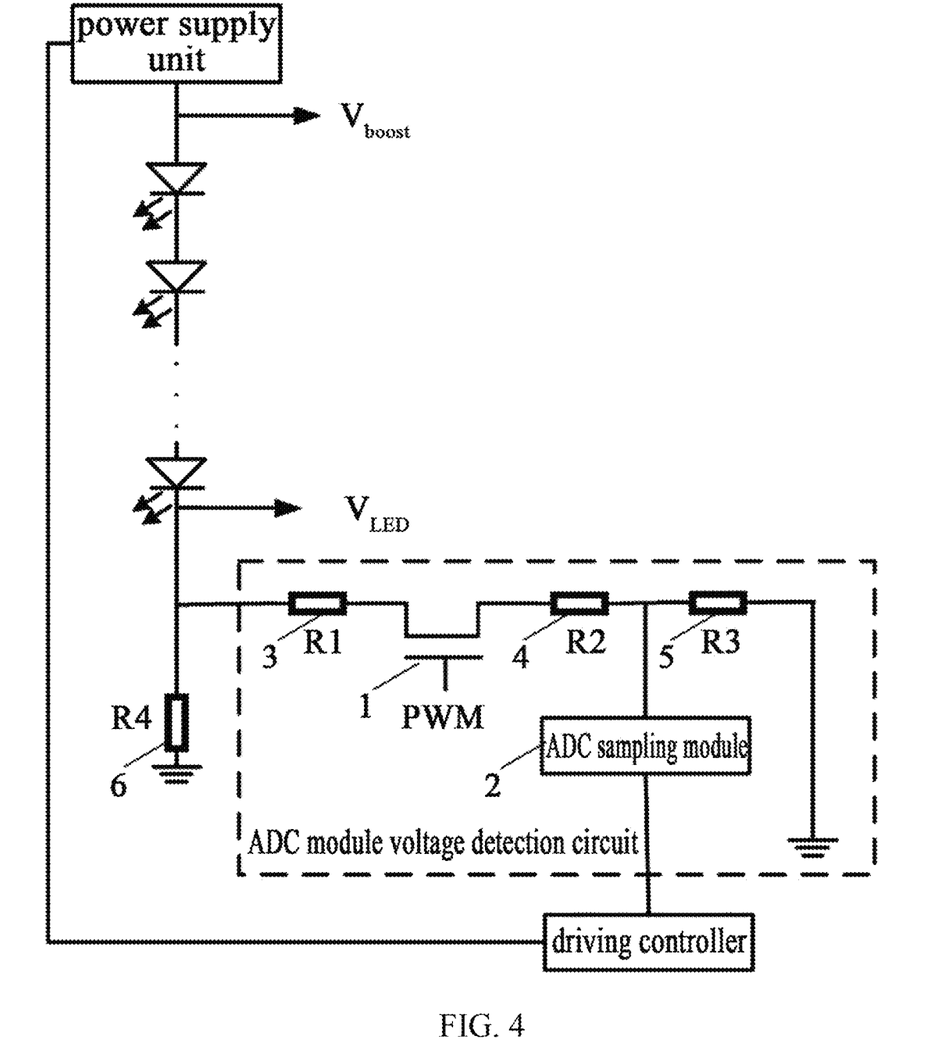
FIG. 4 is a structural diagram of an LED backlight matrix driving circuit according to an embodiment of the present invention.
Figure 5:
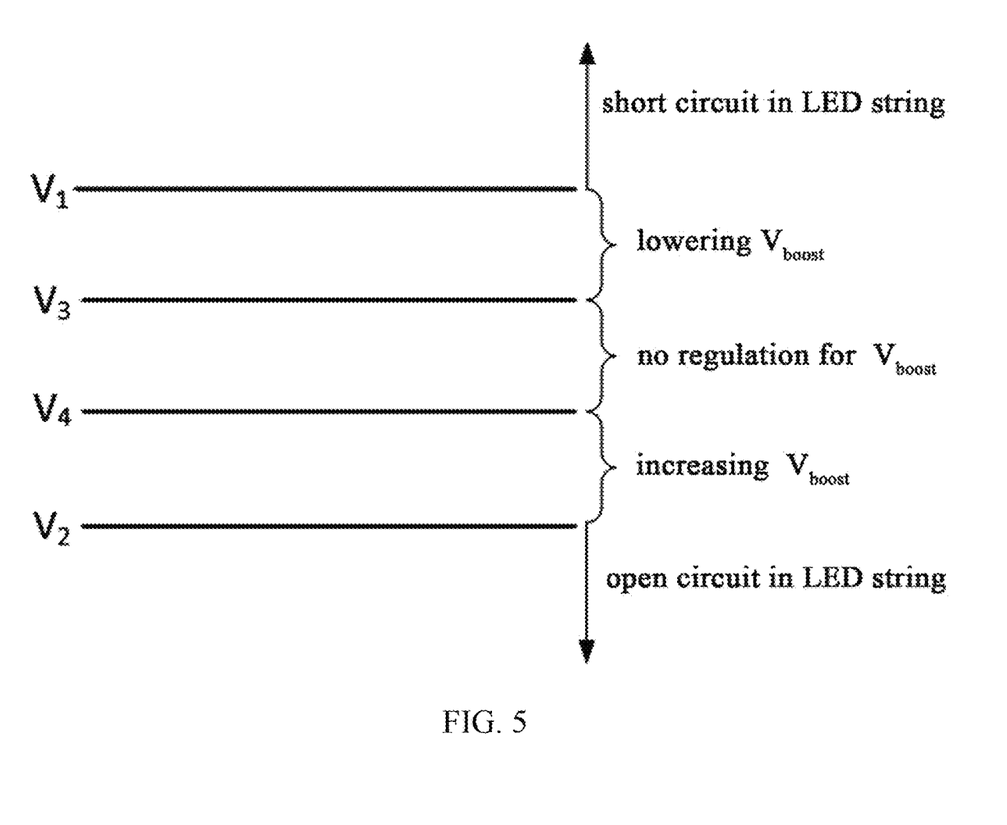
FIG. 5 is a schematic diagram showing the voltage regulation thresholds according to an embodiment of the present invention.

In order to clarify the objects, technical solutions, and advantages of the present invention, the present invention is further described in detail below with reference to FIGS. 3-5.

Figure 1:
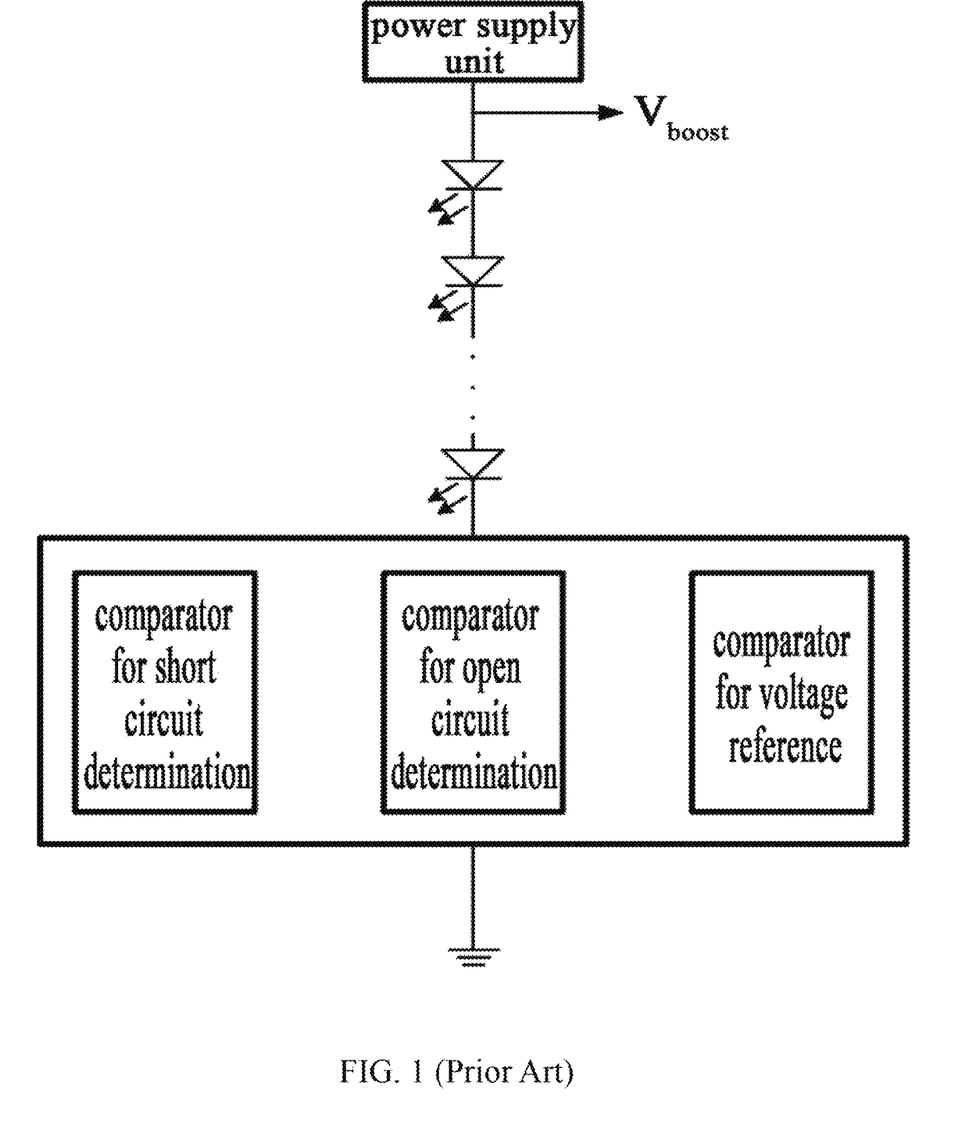
FIG. 1 is a schematic structural diagram of a LED backlight matrix driving circuit in the prior art.
Figure 2:
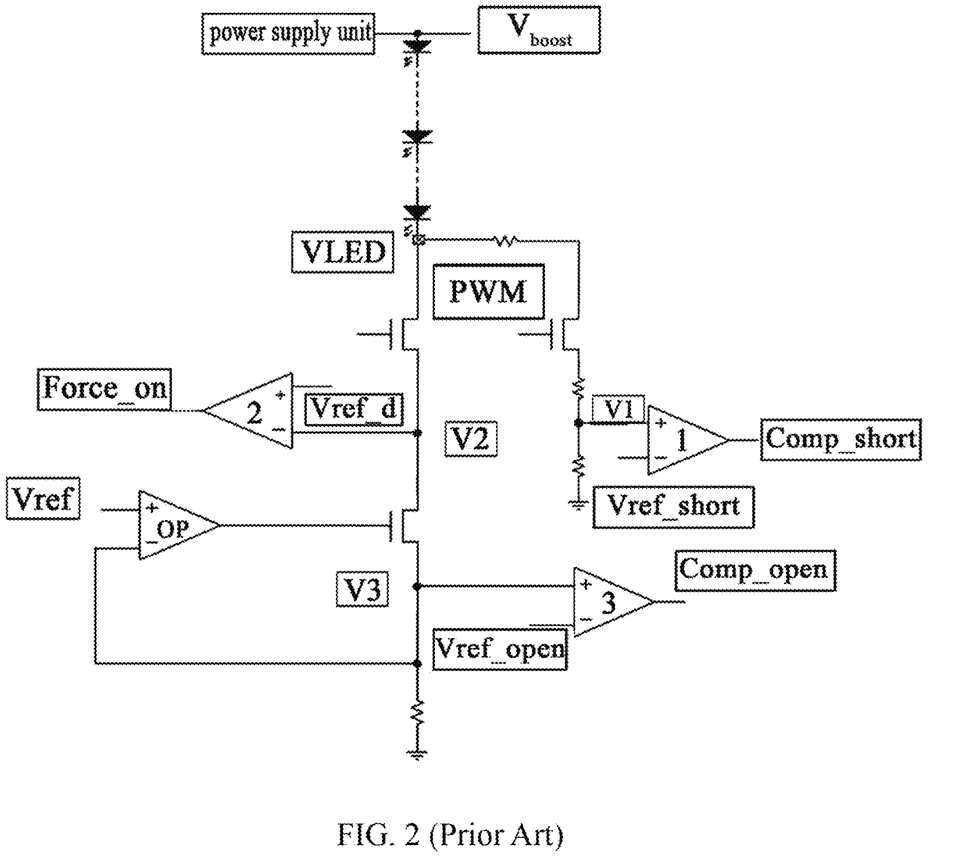
FIG. 2 is a structural diagram of an LED backlight matrix driving circuit in the prior art.
Figure 3:
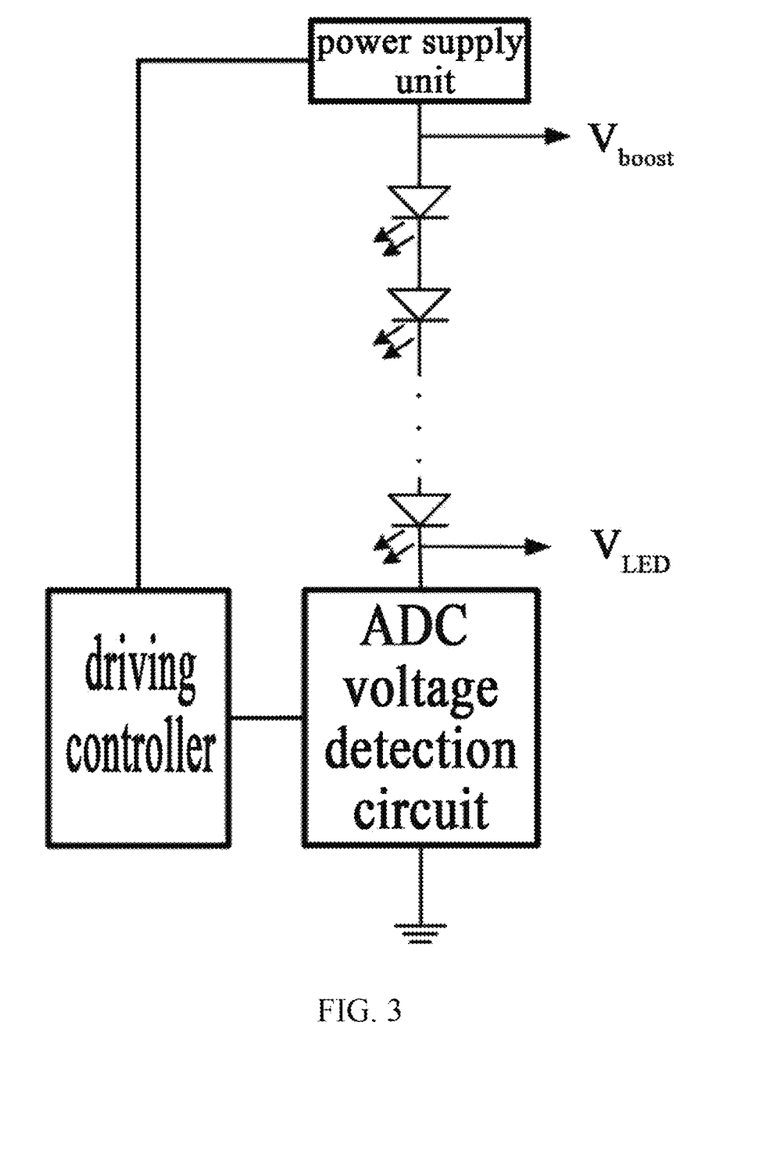
FIG. 3 is a schematic structural diagram of an LED backlight matrix driving circuit according to an embodiment of the present invention.

As shown in FIG. 3, the LED backlight matrix driving circuit with a voltage regulating unit of the present invention includes a power supply unit, an LED string, an ADC voltage detection circuit, and a driving controller.

In this embodiment, the ADC voltage detection circuit is used to detect the voltage value $V_{led}$ at the negative terminal of an LED string, to obtain an accurate measurement value of the negative terminal voltage value $V_{led}$. The ADC voltage detection circuit includes an ADC sampling module that can convert the measured voltage value $V_{led}$ at the negative terminal of the LED string into a voltage numerical code, which is to be output to the driving controller.

In this embodiment, for the numerical code of the negative terminal voltage value $V_{led}$ measured by the ADC sampling module, a first threshold $V_1$, a second threshold $V_2$, a third threshold $V_3$, and a fourth threshold $V_4$ are set, which satisfy a relationship of the first threshold $V_1$>the third threshold $V_3$>the fourth threshold $V_4$>the second threshold $V_2$.

In this embodiment, after the ADC sampling module outputs the numerical code to the driving controller, when the numerical code of the negative terminal voltage value $V_{led}$ measured by the ADC sampling module is greater than or equal to the first threshold value $V_1$, the driving controller determines that a short circuit failure occurs in the LED string in the driving circuit.

When the numerical code of the negative terminal voltage value $V_{led}$ measured by the ADC sampling module is less than or equal to the second threshold value $V_2$, the driving controller determines that an open circuit failure occurs in the LED string in the driving circuit.

When the numerical code of the negative terminal voltage value $V_{led}$ measured by the ADC sampling module is less than or equal to the third threshold value $V_3$ and greater than or equal to the fourth threshold value $V_4$, the driving controller controls the power supply unit to keep a driving voltage $V_{boost}$ unchanged.

When the numerical code of the negative terminal voltage value $V_{led}$ measured by the ADC sampling module is less than the first threshold value $V_1$ and greater than the third threshold value $V_3$, the driving controller controls the power supply unit to lower the driving voltage $V_{boost}$, and the numerical code value of the regulation amount of voltage is the difference between the numerical code of the measured negative terminal voltage value $V_{led}$ and the third threshold value $V_3$.

When the numerical code of the negative terminal voltage value $V_{led}$ measured by the ADC sampling module is greater than the second threshold value $V_2$ and less than the fourth threshold value $V_4$, the driving controller controls the power supply unit to increase the driving voltage $V_{boost}$, and the numerical code of the regulation amount of voltage is the difference between the numerical code of the measured negative terminal voltage value $V_{led}$ and the fourth threshold value $V_4$.

In this embodiment, the ADC voltage detection circuit includes a first control MOS tube 1, the ADC sampling module 2, a first resistor 3, a second resistor 4, and a third resistor 5. The first resistor 3 is connected at one end thereof to the negative terminal of the LED string and at the other end to the drain of the first control MOS tube 1. The source of the first control MOS tube 1 is connected to one end of the second resistor 4, the other end of the second resistor 4 is connected to one end of the third resistor 5, and the other end of the third resistor 5 is grounded. The gate of the first control MOS tube 1 is connected to a PWM control signal. The ADC sampling module 2 samples the potential between the second resistor 4 and the third resistor 5. A fourth resistor 6 is arranged between the negative terminal of the LED string and the ground.

In this embodiment, the LED string includes six LED lamp beads connected in series. The voltage drop of each of the LED lamp beads is 3V, and the total voltage drop of the lamp beads is 18V. The driving voltage $V_{boost}$ is set to 18±20% V, and accordingly the negative terminal voltage value $V_{led}$ of the LED string is $V_{boost}$–18V. The numerical code of the negative terminal voltage value $V_{led}$ of the LED string measured by the ADC sampling module is as an 8-bit value. Namely, different negative terminal voltage values $V_{led}$ of the LED string are expressed as a value of 2 to 256.

In this embodiment, a LED string having three LED lamp beads short-circuited is taken as an example. When three of the LED lamp beads are short-circuited, the total voltage drop is 9V. Accordingly, the numerical code of the negative terminal voltage value $V_{led}$ of the LED string measured by the ADC sampling module has a numerical range of 2 to 256, where 2 represents 0V, . . . , 256 represents 9V, and so on. Namely, the LSB of the ADC sampling module is set to 35 mV.

In this embodiment, the first threshold value $V_1$ is set to 256. Namely, as long as the negative terminal voltage value $V_{led}$ of the LED string measured by the ADC sampling module is greater than or equal to 9V, the ADC sampling module outputs the numerical code of 256. In this case, the driving controller determines that three or more lamp beads in the LED string are short-circuited, and controls to turn off the LED string.

In this embodiment, the first threshold $V_2$ is set to 2. Namely, when the negative terminal voltage value $V_{led}$ of the LED string measured by the ADC sampling module is equal to 0V, the ADC sampling module outputs a numerical code of 2. In this case, the driving controller determines that the LED string is open-circuited.

In this embodiment, the third threshold value $V_3$ and the fourth threshold value $V_4$ can be selected according to the actual working parameters of the LED lamp beads. However, when the negative terminal voltage value $V_{led}$ of the LED string measured by the ADC sampling module is between the fourth threshold value $V_4$*(1/35 mV/LSB) and the third threshold value $V_3$*(1/35 mV/LSB), that is, when the numerical code of the negative terminal voltage value $V_{led}$ measured by the ADC sampling module is less than or equal to the third threshold value $V_3$ and greater than or equal to the fourth threshold value $V_4$, the driving controller controls the power supply unit to keep the driving voltage $V_{boost}$ unchanged. When the negative terminal voltage value $V_{led}$ of the LED string measured by the ADC sampling module is between the third threshold value $V_3$*(1/35 mV/LSB) and 256, the driving controller controls the power supply unit to lower the driving voltage $V_{boost}$, and the numerical code value of the regulation amount of voltage is the difference between the numerical code of the measured negative terminal voltage value $V_{led}$ and the third threshold value $V_3$. When the negative terminal voltage value $V_{led}$ of the LED string measured by the ADC sampling module is between 2 and the fourth threshold value $V_4$*(1/35 mV/LSB), the driving controller controls the power supply unit to increase the driving voltage $V_{boost}$, and the numerical code of the regulation amount of voltage is the difference between the numerical code of the measured negative terminal voltage value $V_{led}$ and the fourth threshold value $V_4$.

The above description is merely a specific example of the present invention, and the protective scope of the present invention is not limited thereto. Any modification or replacement of the present invention made by those skill in the art within the technical specifications described in the present invention should fall within the protective scope of the present invention.

What is claimed is:

1. An LED backlight matrix driving circuit with a voltage regulating unit, wherein the LED backlight driving circuit with a voltage regulating unit comprises a power supply unit, an LED string, an analog to digital converter (ADC) voltage detection circuit, and a driving controller; the ADC voltage detection circuit is configured to detect a voltage value $V_{led}$ of a negative terminal of the LED string, and the ADC voltage detection circuit comprises an ADC sampling module that converts the measured voltage value $V_{led}$ at the negative terminal of the LED string into a voltage numerical code, which is to be output to the driving controller;

for the numerical code of the negative terminal voltage value $V_{led}$ measured by the ADC sampling module, a first threshold value $V_1$ and a second threshold value $V_2$ are set, which satisfy a relationship of the first threshold value $V_1$>the second threshold value $V_2$;

when the numerical code of the negative terminal voltage value $V_{led}$ measured by the ADC sampling module is greater than or equal to the first threshold value $V_1$, the driving controller determines that a short circuit failure occurs in the LED string in the driving circuit;

when the numerical code of the negative terminal voltage value $V_{led}$ measured by the ADC sampling module is less than or equal to the second threshold value $V_2$, the driving controller determines that an open circuit failure occurs in the LED string in the driving circuit;

for the numerical code of the negative terminal voltage value $V_{led}$ measured by the ADC sampling module, a third threshold value $V_3$ and a fourth threshold value $V_4$ are further provided, which satisfy a relationship of the first threshold value $V_1$>the third threshold value $V_3$>the fourth threshold value $V_4$>the second threshold value $V_2$;

when the numerical code of the negative terminal voltage value $V_{led}$ measured by the ADC sampling module is less than or equal to the third threshold value $V_3$ and greater than or equal to the fourth threshold value $V_4$, the driving controller controls the power supply unit to keep a driving voltage $V_{boost}$ unchanged;

when the numerical code of the negative terminal voltage value $V_{led}$ measured by the ADC sampling module is less than the first threshold value $V_1$ and greater than the third threshold value $V_3$, the driving controller controls the power supply unit to lower the driving voltage $V_{boost}$; and when the numerical code of the negative terminal voltage value $V_{led}$ measured by the ADC sampling module is greater than the second threshold value $V_2$ and less than the fourth threshold value $V_4$, the driving controller controls the power supply unit to increase the driving voltage $V_{boost}$.

2. The LED backlight matrix driving circuit according to claim 1, wherein when the driving controller controls the power supply unit to lower the driving voltage $V_{boost}$, a numerical code value of a regulation amount of voltage is a difference between the numerical code of the measured negative terminal voltage value $V_{led}$ and the third threshold value $V_3$; and when the driving controller controls the power supply unit to increase the driving voltage $V_{boost}$, the numerical code value of the regulation amount of voltage is a difference between the numerical code of the measured negative terminal voltage value $V_{led}$ and the fourth threshold value $V_4$.

3. The LED backlight matrix driving circuit according to claim 1, wherein the ADC voltage detection circuit comprises a first control metal oxide semiconductor (MOS) tube, the ADC sampling module, a first resistor, a second resistor, and a third resistor; the first resistor is connected at one end thereof to the negative terminal of the LED string and at the other end to a drain of the first control MOS tube, a source of the first control MOS tube is connected to one end of the second resistor, the other end of the second resistor is connected to one end of the third resistor, and the other end of the third resistor is grounded; and a gate of the first control MOS tube is connected to a PWM control signal, and the ADC sampling module samples a potential between the second resistor and the third resistor.

4. A voltage detection and regulation method for an LED backlight matrix driving circuit, wherein the LED backlight driving circuit comprises a power supply unit, an LED string, an ADC voltage detection circuit, and a driving controller; and the voltage detection and regulation method comprises:

using the ADC voltage detection circuit to detect a voltage value $V_{led}$ of a negative terminal of the LED string, wherein the ADC voltage detection circuit comprises an ADC sampling module that converts the measured voltage value $V_{led}$ at the negative terminal of the LED string into a voltage numerical code, which is to be output to the driving controller;

for the numerical code of the negative terminal voltage value $V_{led}$ measured by the ADC sampling module, providing a first threshold value $V_1$ and a second threshold value $V_2$, which satisfy a relationship of the first threshold value $V_1$>the second threshold value $V_2$;

when the numerical code of the negative terminal voltage value Ved measured by the ADC sampling module is greater than or equal to the first threshold value $V_1$, the driving controller determining that a short circuit failure occurs in the LED string in the driving circuit;

when the numerical code of the negative terminal voltage value $V_{led}$ measured by the ADC sampling module is less than or equal to the second threshold value $V_2$, the driving controller determining that an open circuit failure occurs in the LED string in the driving circuit;

for the numerical code of the negative terminal voltage value $V_{led}$ measured by the ADC sampling module, further providing a third threshold value $V_3$ and a fourth threshold value $V_4$, which satisfy a relationship of the first threshold value $V_1$>the third threshold value $V_3$>the fourth threshold value $V_4$>the second threshold value $V_2$;

when the numerical code of the negative terminal voltage value $V_{led}$ measured by the ADC sampling module is less than or equal to the third threshold value $V_3$ and greater than or equal to the fourth threshold value $V_4$, the driving controller controlling the power supply unit to keep a driving voltage $V_{boost}$ unchanged;

when the numerical code of the negative terminal voltage value $V_{led}$ measured by the ADC sampling module is less than the first threshold value $V_1$ and greater than the third threshold value $V_3$, the driving controller controlling the power supply unit to lower the driving voltage $V_{boost}$; and when the numerical code of the negative terminal voltage value $V_{led}$ measured by the ADC sampling module is greater than the second threshold value $V_2$ and less than the fourth threshold value $V_4$, the driving controller controlling the power supply unit to increase the driving voltage $V_{boost}$.

5. The voltage detection and regulation method for the LED backlight matrix driving circuit according to claim 4, wherein when the driving controller controls the power supply unit to lower the driving voltage $V_{boost}$, a numerical code value of a regulation amount of voltage is a difference between the numerical code of the measured negative terminal voltage value $V_{led}$ and the third threshold value $V_3$; and when the driving controller controls the power supply unit to increase the driving voltage $V_{boost}$, the numerical code value of the regulation amount of voltage is a difference between the numerical code of the measured negative terminal voltage value $V_{led}$ and the fourth threshold value $V_4$.

* * * * *